United States Patent [19]
Lee et al.

[11] Patent Number: 6,121,405
[45] Date of Patent: Sep. 19, 2000

[54] METHOD FOR PREPARING A HIGH-HEAT-RESISTANT-EPOXY-RESIN COMPOSITION COMPRISING PYRAZINIUM SALT CONTAINING A BENZYL GROUP

[75] Inventors: Jae-Rock Lee; Soon-Jin Park; Sang-Bong Lee; Kyu-Wan Lee, all of Daejeon, Rep. of Korea

[73] Assignee: Korea Research Institute of Chemical Technology, Daejeon, Rep. of Korea

[21] Appl. No.: 08/959,889

[22] Filed: Oct. 29, 1997

[30] Foreign Application Priority Data

Oct. 30, 1996 [KR] Rep. of Korea ............... 96-51719

[51] Int. Cl.[7] .................................................. C08G 528/92
[52] U.S. Cl. ..................... 528/92; 502/224; 502/353; 525/504; 525/506; 528/94
[58] Field of Search ................................ 502/224, 353; 528/92, 94; 525/504, 506

[56] References Cited

U.S. PATENT DOCUMENTS 4,393,185  7/1983  Berner et al. ............... 528/92
5,541,000  7/1996  Hardy et al. ............... 528/92

FOREIGN PATENT DOCUMENTS 6-321915  11/1994  Japan .

*Primary Examiner*—Robert Dawson
*Assistant Examiner*—D. Aylward
*Attorney, Agent, or Firm*—Ladas & Parry

[57] ABSTRACT

A method for preparing a high-heat-resistant-epoxy-resin composition which comprises adding, as catalytic curing agent, a pyrazinium salt having a benzyl group to difunctional and multifunctional epoxy resin and thermoset resin having a similar structure. The epoxy-resin composition obtained by the present invention is excellent in its impregnating property, processability, impact resistance, drug resistance, electric-insulating property, and adhesiveness.

35 Claims, No Drawings

METHOD FOR PREPARING A HIGH-HEAT-RESISTANT-EPOXY-RESIN COMPOSITION COMPRISING PYRAZINIUM SALT CONTAINING A BENZYL GROUP

FIELD OF THE INVENTION

The present invention relates to a method for preparing a high-heat-resistant-epoxy-resin composition. More specifically, it relates to a method for preparing an epoxy-resin composition which ameliorates or prevents the decrease of the thermal property of epoxy monomer when the epoxy is cured and which can be used at high temperatures by using a pyrazinium salt having a benzyl group as a potential catalytic curing agent capable of curing in a short period under conditions allowing good processability.

BACKGROUND OF THE INVENTION

It is well known that epoxy resin, one of the thermoset resins, is a high-molecular-weight material having good heat resistance, mechanical properties, electric insulating properties, adhesiveness and weather resistance; and epoxy resin is used as paint, an electric insulating material, a stabilizer for vinyl chloride, a coating and a matrix resin of fiber-reinforced complex material. It may fairly be said that these widely varying industrial applications of epoxy resin have resulted from the development of curing technology; and, thus, the effect of the curing agent on epoxy resin is enormous.

Specifically, epoxy resin requires the use of a curing agent in order to create a three-dimensional net structure; and, therefore, the heat resistance and the final mechanical properties of the epoxy resin may be different depending on the nature of this curing agent. Curing agents having components harmful to the human body (e.g., amine compounds) are frequently used, which results in many problems. The use of such curing agents in combination with additives such as accelerators, plasticizers, fillers, mold-releasing agents, flame retardants, diluents and dyes largely reduces the physical properties of the epoxy resin.

Further, the use of a curing agent comprising an amine (e.g., DDS: 4,4-diaminodiphenylsulfone) may result in decreased processability due to its high viscosity; and, thus, the production of molded products using such a curing agent becomes very difficult.

On the other hand, in the electric and electronic industries and the automobile industries, which lead the leading-edge industries, one would expect to see the development of epoxy resins that are capable of curing at a relatively low temperature of approximately 80 to approximately 120° C. in a short time, are capable of generally completely curing within approximately 30 to approximately 120 minutes, are capable of being stored at room temperature more than about six months, are capable of maintaining their physical properties at high temperatures more than approximately 180° C., and are cost-effective compared to other high-heat-resistant resins such as bismaleimide triazine resins or polyimide resins. However, there appears to be no report of such resins being developed.

SUMMARY

It is an object of the present invention to provide a method for preparing an epoxy resin composition which meets the above-mentioned conditions (such as low-temperature curing), which increases the physical properties of the epoxy resin itself with the use of a small amount of catalytic curing agent, and, optionally, which ensures high heat resistance by the addition of an existing high-heat-resistant-curing agent or which alternatively increases physical properties such as heat resistance by the addition of other thermoset and thermoplastic matrix resin in the course of the production of the epoxy-resin composition.

This object can be attained by adding a pyrazinium salt having a benzyl group as a catalytic curing agent to difunctional and multifunctional epoxy resin and thermoset resin having a similar structure.

DETAILED DESCRIPTION

It has now been found that the addition of a pyrazinium salt having a benzyl group to difunctional and multifunctional epoxy resin and thermoset resins of a similar structure can primarily form three-dimensional net-structure precursor material and shows heat stability in cases of increased curing temperature, thereby causing the resulting curable composition to show heat resistance approximately 20% to approximately 400% higher than that of the existing thermoset resin.

In addition, it has also been found that, in curing by using just a curing agent prepared according to the present invention without using any other existing curing agents, the viscosity of the resin at approximately 110 to approximately 190° C. is very low—approximately like water—and the impregnation properties and processability of the resin are excellent.

In the curing technology of the existing epoxy resin and similar curable resin, the use of catalytic curing agent prepared according to the present invention can reduce detrimental effects on the human body and the environment due to the use of amine-type curing agents.

Moreover, when a pyrazinium salt having a benzyl group according to the present invention is used together with an existing amine-type curing agent, a thermoset epoxy resin composition and a resin composition of a similar structure having high heat resistance, high impact resistance, high drug resistance, high electric insulating property and high adhesiveness can be obtained.

When approximately 0.01% to approximately 50.5% of pyrazinium salt having a benzyl group according to the present invention is added without the existing curing agent, the autocatalytic reaction of the epoxy resin and the resin having a similar structure can be accelerated.

As a pyrazinium salt having a benzyl group according to the present invention is added, the epoxy resin and the resin having a similar structure have a constant or generally constant linear or generally linear expansion coefficient at approximately 60° C. to approximately 360° C., showing heat stability at that temperature; and, thus, the mechanical property of the resins is maintained.

As a pyrazinium salt having a benzyl group according to the present invention is added, the thermal decomposition temperature begins at approximately 250° C. or more, depending on whether the epoxy is difunctional or multifunctional The viscosity of the resin surprisingly increases at approximately 140° C. or more to give a solid material. However, during the reaction period at that temperature, shrinkage of the resin, which was shown in existing epoxy resin and resin of similar structures, does not occur. On the contrary, an increase of the volume from approximately 0.01 to approximately 15% occurs and provides satisfactory molding conditions, thereby rendering a good dimensional property in the processing production.

The catalyst used as a curing agent in the present invention is a pyrazinium salt having a benzyl group, namely, N-benzyl pyrazinium salt known for having high activity, preferably N-benzyl pyrazinium hexafluoroantimonate. Thus, in one embodiment, the present invention includes a catalytic curing agent for preparing a high-heat-resistant-epoxy-resin composition, the curing agent comprising, consisting of, or consisting essentially of a pyrazinium salt having a benzyl group. More specifically, the curing agent comprises, consists of, or consists essentially of N-benzyl pyrazinium salt. More specifically, the curing agent comprises, consists of, or consists essentially of N-benzyl pyrazinium salt, wherein the N-benzyl pyrazinium salt is N-benzyl pyrazinium hexafluoroantimonate.

The N-benzyl pyrazinium hexafluoroantimonate is prepared by the Korean Research Institute of Chemical Technology by reacting benzyl bromide with pyrazine at room temperature, filtering the resulting insoluble benzyl pyrazinium salt, dissolving it in aqueous solution, adding $NaSbF_6$ to the solution, and filtering, recrystallizing, purifying, and drying the resulting white solid. The resulting compound is represented by the following formula

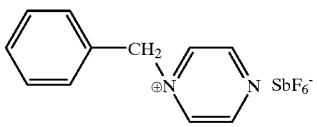

The N-benzyl-pyrazinium-hexafluoroantimonate according to the present invention has the following approximate physical properties:

Melting point: 138.1–142.2° C.

1H NMR (acetone-$d_6$): δ=9.33–9.38 (d, 2H, Py) 9.65–9.70 (d, 2H, Py) 7.70–7.47 (m, 5H, Ph) 6.18 (s, 2H, —CH2—)

IR (KBr) ν=1514, 1358, 1223, 1073, 1015, 767, 726, 662 $cm^{-1}$ $C_{11}H_{11}N_2SbF_6$=Calculated: C: 32.45% H: 2.70% N: 6.88% Found: C: 32.90% H: 2.74% N: 6.91%

The catalytic curing agent according to the present invention has a longer storage effect on epoxy resin than the one prepared by using the existing amine-type curing agent, initiates the curing reaction in a short time, and has a low hygroscopic property and excellent water resistance and drug resistance.

As mentioned above, since it is possible to carry out the curing reaction using only a catalytic curing agent according to the present invention without forming noxious gases such as amine during the curing reaction, the curing agent according to the present invention is expected to act as an environmentally-clean additive for providing electrical and electronic parts, print-substrate raw materials, electrical insulating materials, adhesive and fiber-reinforced prepregs. Optionally, the catalytic curing agent of the present invention may be used as a curing accelerator in resin formulation, which is used as flame retardant, extender, antistatic agent, surfactant, pigment, paint, or dye.

The present invention will now be explained in more detail with reference to the following examples and comparative examples, but it is to be understood that the present invention is not restricted thereto and various modifications are possible within the scope of the invention.

EXAMPLE 1

Approximately 1% by weight of the catalytic curing agent according to the present invention was added to the difunctional epoxy resin LY556 (manufactured by Ciba-Geigy AG) and was allowed to stand at approximately 170° C. for about one hour to give a resilient polymer. The analysis to determine mass change was carried out by Thermo-Gravimetric Analysis (TGA) under a nitrogen atmosphere in an amount of approximately 50 $cm^3$/minute while keeping the rate of temperature elevation to approximately 10° C./minute. The thermal decomposition began at approximately 361° C. In view of the fact that the heat resistance of difunctional epoxy resins is approximately 90 to approximately 150° C., an increase in the heat resistance of two to three times or more was shown.

In order to check and analyze the above result, a sample obtained by adding curing agent to the resin used in this example (LY556) and maintained at approximately 130° C. for about 10 minutes was analyzed by using NMR and an FTIR analyzer; it was found that a new material was formed starting from the original composition.

The material is referred to as a precursor material for forming final cured product from epoxy resin (LY556). It was noted that a precursor as a cured product having thermal stability at a high temperature was previously formed in the course of the curing reaction, and thus satisfied the final curing condition at a higher temperature and resulted in a remarkably improved thermal decomposition starting temperature.

EXAMPLE 2

Approximately 1% by weight of the catalytic curing agent according to the present invention was added to difunctional epoxy resin LY5082 (manufactured by Ciba-Geigy AG) and was allowed to stand at 170° C. for approximately one hour to give a resilient polymer. The thermal decomposition began at approximately 268° C., which was determined by the same method as in Example 1. In view of the fact that the heat resistance of difunctional epoxy resins is approximately 90 to approximately 150° C., an increase in the heat resistance of two to three times or more was shown.

In order to check and analyze the above result, a sample obtained by adding the catalytic curing agent according to the present invention to the resin used in this example (LY5082) and maintained at approximately 130° C. for about 10 minutes was analyzed by using NMR and an FTIR analyzer; and it was found that a new material was formed starting from the original composition.

The material is referred to as a precursor material for forming final a cured product from epoxy resin (LY5082). It was noted that a precursor as a cured product having thermal stability at a high temperature was previously formed in the course of the curing reaction, and thus satisfied the final curing condition at a higher temperature and resulted in a remarkably improved thermal decomposition starting temperature.

EXAMPLE 3

Approximately 1% by weight of the catalytic curing agent according to the present invention was added to difunctional epoxy resin LY556 (manufactured by Ciba-Geigy AG), and the resulting product was subjected to RDA (Rheological Dynamic Analyzer), which is capable of analyzing the change of viscosity and the linear expansion coefficient according to temperature while maintaining the temperature increase rate at approximately 5° C./minute. As a result, the viscosity of the resin decreased approximately to the level of water at around 140° C. Therefore, it was found that the precursor prepared by the present invention had very low viscosity and thus high impregnation processability. The viscosity increased drastically at around 190° C. as the temperature continuously increased; and, thus, a high-resilient solid material was obtained. It is worth special mention that the volume shrinkage occurring in the case of the curing reaction of the general epoxy resin was not found and instead showed some volume increase.

EXAMPLE 4

Approximately 1% by weight of the catalytic curing agent according to the present invention was added to the difunctional epoxy resin LY5082 (manufactured by Ciba-Geigy AG), and the viscosity was determined by the same method as in Example 3. As a result, it was found that the resulting precursor resin had very low viscosity and high impregnation processability. The viscosity of the resin increased drastically at around 190° C.; and, thus, a high resilient solid material was obtained. The volume shrinkage occurring in the case of the curing reaction of the general epoxy resin was not found and instead showed some volume increase.

Comparative Example 1

Approximately 1% by weight of the catalytic curing agent according to the present invention was added to the difunctional epoxy resin LY556 (manufactured by Ciba-Geigy AG). The analysis to determine thermal capacity and enthalpy change was carried out by Differential Scanning Analysis (DSC) under a nitrogen atmosphere in an amount of approximately 50 cm$^3$/minute while keeping the temperature elevating rate at approximately 10° C./minute. A three-dimensional net structure was formed around the thermal decomposition starting at a temperature of about 203° C. When observing the thermoset reaction of a typical epoxy resin, it was noted that a complete curing proceeded after a three-dimensional net structure was formed with the increase of temperature, while the thermal decomposition reaction occurred as the temperature continuously increased. This result shows that the heat resistance of the epoxy resin was considerably improved as shown in Example 1.

Comparative Example 2

Approximately 1% by weight of the catalytic curing agent according to the present invention was added to difunctional epoxy resin LY556 (manufactured by Ciba-Geigy AG) and was allowed to stand at approximately 170° C. for about one hour to give a polymer. The linear expansion coefficient according to the temperature was determined by using Thermo-Mechanical Analysis (TMA), which determines the change of the mechanical property under a nitrogen atmosphere in an amount of approximately 50 cm$^3$/minute while keeping the rate of temperature elevation at approximately 10° C./minute. The coefficient showed a constant value, namely approximately $1.648 \times 10^{-4} K^{-1}$ at approximately 130° C. to approximately 250° C. This indicated that the epoxy resin had heat stability up to approximately 250° C.; its distinguishable decomposition temperature was much higher than that temperature, which was confirmed by comparing the resulting data of Examples 1 and 3.

Comparative Example 3

Approximately 1% by weight of the catalytic curing agent according to the present invention was added to the difunctional epoxy resin LY5082 (manufactured by Ciba-Geigy AG) and was allowed to stand at approximately 170° C. for about one hour to give a polymer. According to the same determination method used in Comparative Example 2, the coefficient showed constant value, namely approximately $1.850 \times 10^{-4} K^{-1}$ at approximately 125 to approximately 250° C. This indicated that the epoxy resin had heat stability up to approximately 250° C.; and its distinguishable decomposition temperature was much higher than that temperature, which was confirmed by comparing the resulting data of Examples 2 and 4.

The invention illustratively disclosed herein suitably may be practiced in the absence of any element which is not specifically disclosed herein. Thus, the invention may comprise, consist of, or consist essentially of the elements disclosed herein.

Although the present invention has been described in considerable detail with reference to certain preferred embodiments, the spirit and the scope of the appended claims should not be limited to the description of the preferred embodiments contained herein.

What is claimed is:

1. A method for preparing a high-heat-resistant-epoxy-resin composition, the method comprising the following steps:
   (a) adding a catalytic curing agent to a difunctional epoxy resin to yield a resin mixture having a temperature and a viscosity;
   (b) increasing the temperature of the resin mixture to at least approximately 110° C. to yield a precursor material having a viscosity less than the viscosity of the resin mixture in step (a), wherein the precursor material has a temperature;
   (c) increasing the temperature of the precursor material to at least approximately 170° C. to cure the precursor material to yield the high-heat-resistant-epoxy-resin composition,
   wherein the catalytic curing agent comprises N-benzyl-pyrazinium-hexafluoroantimonate represented by the following formula

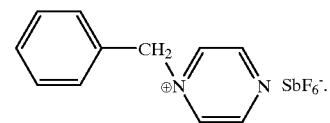

2. A method as claimed in claim 1 for preparing an epoxy-resin composition having high heat resistance, high impact resistance, high drug resistance, high electric insulating property and high adhesiveness, wherein the catalytic curing agent further comprises an amine.

3. A method as claimed in claim 1, wherein the catalytic curing agent further comprises an amine curing agent.

4. A method for preparing a high-heat-resistant-epoxy-resin composition, the method comprising the following steps:
   (a) adding a catalytic curing agent to a difunctional epoxy resin to yield a resin mixture having a temperature and a viscosity;
   (b) increasing the temperature of the resin mixture to at least approximately 110° C. to yield a precursor material having a viscosity less than the viscosity of the resin mixture in step (a), wherein the precursor material has a temperature;
   (c) increasing the temperature of the precursor material to at least approximately 170° C. to cure the precursor material to yield the high-heat-resistant-epoxy-resin composition;

wherein the catalytic curing agent consists essentially of N-benzyl-pyrazinium-hexafluoroantimonate represented by the following formula

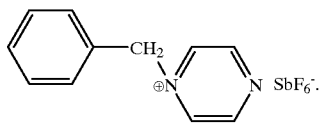

5. A method as claimed in claim 1, wherein the curing agent further comprises an amine.

6. A method as claimed in claim 1, wherein in step (b) the viscosity of the precursor material is approximately equal to viscosity of water.

7. A method as claimed in claim 1, wherein the precursor material has a volume and the high-heat-resistant-epoxy-resin composition has a volume, and wherein the volume of the high-heat-resistant-epoxy-resin composition is greater than the volume of the precursor material.

8. A method as claimed in claim 7, wherein the volume of the high-heat-resistant-epoxy-resin composition is approximately 0.01% to approximately 15% greater than the volume of the precursor material.

9. A method as claimed in claim 1, wherein in step (b) the temperature of the resin mixture is increased to approximately 110° C. to approximately 140° C.

10. A method as claimed in claim 1, wherein in step (c) the temperature of the precursor material is increased to approximately 170° C. to approximately 190° C.

11. A method as claimed in claim 9, wherein in step (c) the temperature of the precursor material is increased to approximately 170° C. to approximately 190° C.

12. A method as claimed in claim 1, wherein thermal decomposition of the high-heat-resistant-epoxy-resin composition begins at approximately 250° C. or more.

13. A method as claimed in claim 1,
wherein in step (b) the temperature of the resin mixture is increased to approximately 110° C. to approximately 140° C.;
wherein in step (c) the temperature of the precursor material is increased to approximately 170° C. to approximately 190° C.; and
wherein the precursor material has a volume and the high-heat-resistant-epoxy-resin composition has a volume, and wherein the volume of the high-heat-resistant-epoxy-resin composition is greater than the volume of the precursor material.

14. A method as claimed in claim 3,
wherein in step (b) the temperature of the resin mixture is increased to approximately 110° C. to approximately 140° C.;
wherein in step (c) the temperature of the precursor material is increased to approximately 170° C. to approximately 190° C.; and
wherein the precursor material has a volume and the high-heat-resistant-epoxy-resin composition has a volume, and wherein the volume of the high-heat-resistant-epoxy-resin composition is greater than the volume of the precursor material.

15. A high-heat-resistant-epoxy-resin composition made by the method claimed in claim 1.

16. A high-heat-resistant-epoxy-resin composition as claimed in claim 15, wherein the precursor material has a volume and the high-heat-resistant-epoxy-resin composition has a volume, and wherein the volume of the high-heat-resistant-epoxy-resin composition is greater than the volume of the precursor material.

17. A high-heat-resistant-epoxy-resin composition as claimed in claim 16, wherein the volume of the high-heat-resistant-epoxy-resin composition is approximately 0.01% to approximately 15% greater than the volume of the precursor material.

18. A high-heat-resistant-epoxy-resin composition as claimed in claim 15, wherein thermal decomposition of the high-heat-resistant-epoxy-resin composition begins at approximately 250° C. or more.

19. A high-heat-resistant-epoxy-resin composition as claimed in claim 16, wherein thermal decomposition of the high-heat-resistant-epoxy-resin composition begins at approximately 250° C. or more.

20. A high-heat-resistant-epoxy-resin composition made by the method claimed in claim 13.

21. A method for preparing a high-heat-resistant-epoxy-resin composition, the method comprising the following steps:
(a) adding a catalytic curing agent to a difunctional epoxy resin to yield a resin mixture having a temperature and a viscosity;
(b) increasing the temperature of the resin mixture to yield a precursor material having a viscosity approximately equal to viscosity of water, wherein the precursor material has a temperature;
(c) increasing the temperature of the precursor material to cure the precursor material to yield the high-heat-resistant-epoxy-resin composition;
wherein the catalytic curing agent comprises N-benzyl-pyrazinium-hexafluoroantimonate represented by the following formula

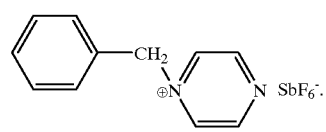

22. A method as claimed in claim 21, wherein the catalytic curing agent further comprises an amine.

23. A method as claimed in claim 21, wherein the catalytic curing agent further comprises an amine curing agent.

24. A method as claimed in claim 21, wherein the precursor material has a volume and the high-heat-resistant-epoxy-resin composition has a volume, and wherein the volume of the high-heat-resistant-epoxy-resin composition is greater than the volume of the precursor material.

25. A method as claimed in claim 24, wherein the volume of the high-heat-resistant-epoxy-resin composition is approximately 0.01% to approximately 15% greater than the volume of the precursor material.

26. A method as claimed in claim 21, wherein thermal decomposition of the high-heat-resistant-epoxy-resin composition begins at approximately 250° C. or more.

27. A high-heat-resistant-epoxy-resin composition made by the method claimed in claim 21.

28. A high-heat-resistant-epoxy-resin composition as claimed in claim 27, wherein the precursor material has a volume and the high-heat-resistant-epoxy-resin composition has a volume, and wherein the volume of the high-heat-resistant-epoxy-resin composition is greater than the volume of the precursor material.

29. A high-heat-resistant-epoxy-resin composition as claimed in claim 28, wherein the volume of the high-heatresistant-epoxy-resin composition is approximately 0.01% to approximately 15% greater than the volume of the precursor material.

30. A high-heat-resistant-epoxy-resin composition as claimed in claim 27, wherein thermal decomposition of the high-heat-resistant-epoxy-resin composition begins at approximately 250° C. or more.

31. A high-heat-resistant-epoxy-resin composition as claimed in claim 28, wherein thermal decomposition of the high-heat-resistant-epoxy-resin composition begins at approximately 250° C. or more.

32. A method as claimed in claim 21, wherein the temperature of the resin mixture in step (b) is increased to at least approximately 110° C.

33. A method as claimed in claim 21, wherein the temperature of the precursor material in step (c) is increased to at least approximately 170° C.

34. A method as claimed in claim 1, wherein the catalytic curing agent further comprises 4,4-diaminodiphenylsulfone.

35. A method as claimed in claim 21, wherein the catalytic curing agent further comprises 4,4-diaminodiphenylsulfone.

* * * * *